United States Patent
Liu et al.

(10) Patent No.: US 10,670,627 B2
(45) Date of Patent: Jun. 2, 2020

(54) ELECTRICAL PROBE STRUCTURE

(71) Applicant: CHROMA ATE INC., Taoyuan (TW)

(72) Inventors: Mao-Sheng Liu, Tao-Yuan Hsien (TW); Peng-Fei Chen, Tao-Yuan Hsien (TW)

(73) Assignee: CHROMA ATE INC., Taoyuan (TW)

( * ) Notice: Subject to any disclaimer, the term of this patent is extended or adjusted under 35 U.S.C. 154(b) by 45 days.

(21) Appl. No.: 16/221,067

(22) Filed: Dec. 14, 2018

(65) Prior Publication Data
US 2019/0187176 A1 Jun. 20, 2019

(30) Foreign Application Priority Data

Dec. 15, 2017 (TW) .............................. 106144051 A

(51) Int. Cl.
  *G01R 1/04* (2006.01)
  *G01R 1/067* (2006.01)
  G01R 31/28 (2006.01)
  G01R 27/26 (2006.01)
(52) U.S. Cl.
  CPC ......... *G01R 1/0416* (2013.01); *G01R 1/0675* (2013.01); *G01R 1/06716* (2013.01); G01R 27/2676 (2013.01); G01R 31/2889 (2013.01)
(58) Field of Classification Search
  CPC ... G01R 1/00; G01R 1/02; G01R 1/04; G01R 1/0408; G01R 1/0416; G01R 1/06; G01R 1/067; G01R 1/06711; G01R 1/06716; G01R 1/06733; G01R 1/0675; G01R 1/06794; G01R 3/00; G01R 19/00; G01R 19/145; G01R 19/15; G01R 19/155; G01R 19/165; G01R 27/00; G01R 27/02; G01R 27/26; G01R 27/2617; G01R 27/2623; G01R 27/2676; G01R 31/00; G01R 31/28; G01R 31/2801; G01R 31/2806; G01R 31/2808; G01R 31/2886; G01R 31/2889
  USPC ...... 324/500, 537, 755.01, 755.11, 690, 696, 324/724, 72.5, 76.11, 149, 437, 445, 446; 340/596; 600/11, 407, 437, 459, 462
  See application file for complete search history.

(56) References Cited

U.S. PATENT DOCUMENTS

| | | | | |
|---|---|---|---|---|
| 3,731,191 A | * | 5/1973 | Bullard | G01R 1/07314 324/750.25 |
| 4,377,733 A | * | 3/1983 | Yamaguchi | G01K 1/024 219/516 |
| 5,370,675 A | * | 12/1994 | Edwards | A61B 18/1477 607/101 |

(Continued)

*Primary Examiner* — Hoai-An D. Nguyen
(74) *Attorney, Agent, or Firm* — Muncy, Geissler, Olds & Lowe, P.C.

(57) ABSTRACT

An electrical probe structure includes a conductive cylinder, a first electrical connecting port and a probe assembly. The conductive cylinder for being fixed to the base plate has thereinside a sliding tunnel. The first electrical connecting port is electrically connected to the conductive cylinder. The at least one flexible conductive tube is furnished inside the sliding tunnel. The at least one probe assembly includes a first needle cylinder and a first probe. The first needle cylinder, slidably penetrating the conductive cylinder, electrically contacts the at least one flexible conductive tube so as to have the first needle cylinder to electrically connect the first electrical connecting port via the at least one flexible conductive tube and the conductive cylinder. The first probe is mounted and electrically connected to the first needle cylinder.

10 Claims, 7 Drawing Sheets

(56) References Cited

U.S. PATENT DOCUMENTS

| | | | |
|---|---|---|---|
| 9,618,536 B2* | 4/2017 | Kuo | G01R 1/07357 |
| 10,386,205 B2* | 8/2019 | Utermoehlen | G01D 5/243 |
| 2004/0044309 A1* | 3/2004 | Owens | A61M 25/104 |
| | | | 604/103.06 |
| 2011/0270037 A1* | 11/2011 | Soutorine | A61M 25/005 |
| | | | 600/139 |
| 2014/0266280 A1* | 9/2014 | Yeh | G01R 3/00 |
| | | | 324/755.11 |

* cited by examiner

ELECTRICAL PROBE STRUCTURE

This application claims the benefit of Taiwan Patent Application Serial No. 106144051, filed on Dec. 15, 2017, the subject matter of which is incorporated herein by reference.

BACKGROUND OF THE INVENTION

1. Field of the Invention

The invention relates to an electrical probe structure, and more particularly to the electrical probe structure that has a conductive cylinder.

2. Description of the Prior Art

Currently, in the art, instruments or devices for measuring specific electric properties such as resistance values and/or voltage values, usually apply a large current (ranged from 10 s to 100 s amperes for example). Before electric merchandise is launched, the manufacturer or retailer usually applies plural probe sets of measurement instruments to perform electric testing, at multiple selected points, so as to verify yield and reliability of the merchandise. Generally, the probe set of the measurement instrument is fixed on a plate, and has a driving end and a detecting end. The driving end and the detecting end are individually connected with respective wires. When the probe set contacts and thus displaces the object to be detected, wiring inside the measurement device would be shifted accordingly, and friction between wires would be inevitable. In such a circumstance, structural damages or broken wires to the measurement device might be highly possible. Extremely, circuit short may occur to fail the measurement device. In addition, rooms inside the measurement device would be occupied mostly by the coarse wires, and heat generated from the large current passing through the coarse wires would be accumulated inside the device, and hard to be dissipated.

SUMMARY OF THE INVENTION

Accordingly, it is an object of the present invention to provide an electrical probe structure that can resolve problems of abrasive wears and heat accumulation to the conventional the measurement device due to internal crowded wiring thereof.

In the present invention, the electrical probe structure includes a conductive cylinder, a first electrical connecting port and a probe assembly. The conductive cylinder for being fixed to the base plate has thereinside a sliding tunnel. The first electrical connecting port is electrically connected to the conductive cylinder. The at least one flexible conductive tube is furnished inside the sliding tunnel. The at least one probe assembly includes a first needle cylinder and a first probe. The first needle cylinder, slidably penetrating the conductive cylinder, electrically contacts the at least one flexible conductive tube so as to have the first needle cylinder to electrically connect the first electrical connecting port via the at least one flexible conductive tube and the conductive cylinder. The first probe is mounted and electrically connected to the first needle cylinder.

As stated, in the electrical probe structure provided by the present invention, the pair of the conductive dome structure fixed on the base plate and the first electrical connecting port fixed on the conductive dome structure is used to replace the conventional probe set that moves with the wire for the large current passing through, such that any movement of the electrical probe structure won't shift the conductive cylinder and the first electrical connecting port. Thus, the abrasive wears upon the internal wires of the measurement device having the electrical probe structure can be successfully avoided. In addition, since the conventional wires originally for the large current passing through have been removed, the internal space of the measurement device having the electrical probe structure can be wider, and thus capability in heat dissipation of the measurement device having the electrical probe structure can be substantially enhanced.

All these objects are achieved by the electrical probe structure described below.

BRIEF DESCRIPTION OF THE DRAWINGS

The present invention will now be specified with reference to its preferred embodiment illustrated in the drawings, in which.

DESCRIPTION OF THE PREFERRED EMBODIMENT

The invention disclosed herein is directed to an electrical probe structure. In the following description, numerous details are set forth in order to provide a thorough understanding of the present invention. It will be appreciated by one skilled in the art that variations of these specific details are possible while still achieving the results of the present invention. In other instance, well-known components are not described in detail in order not to unnecessarily obscure the present invention.

Figure 1:
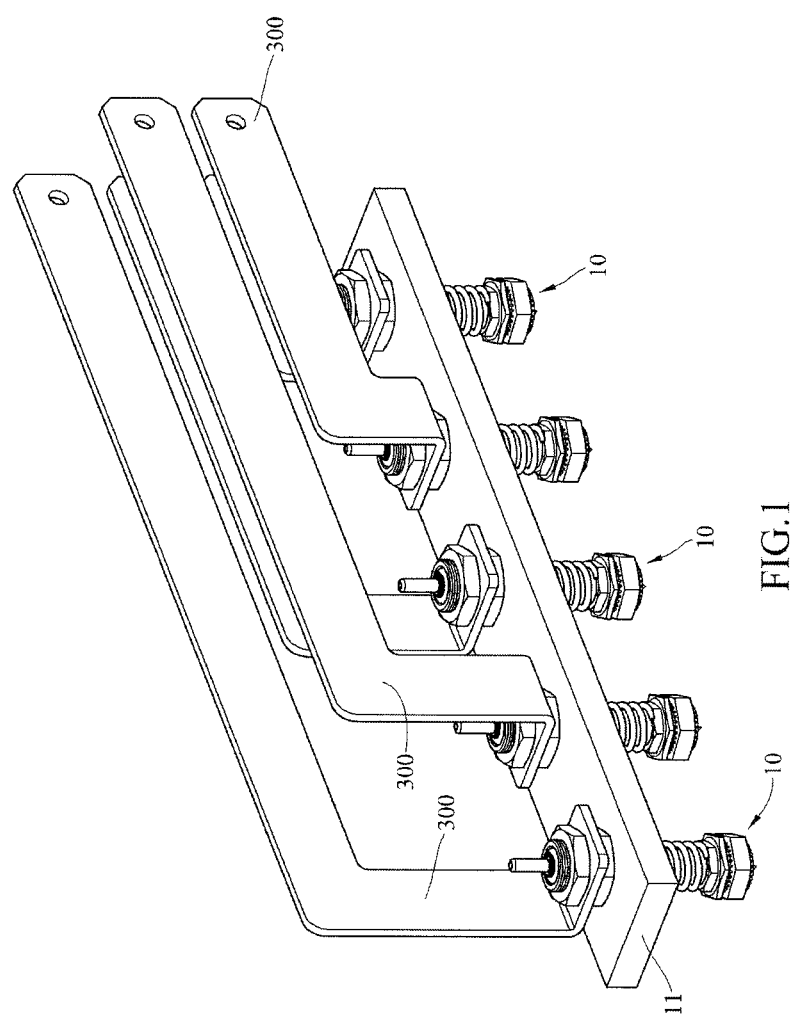
FIG. 1 is a schematic perspective view of a first embodiment of the present invention that includes a plurality of electrical probe structures mounted on a base plate.

Referring now to FIG. 1, a schematic perspective view of a first embodiment of the present invention that includes a plurality of electrical probe structures mounted on a base plate is shown.

In this embodiment, the electrical probe structures 10 (five shown in the figure) are mounted on a base plate 11 of a measurement device, for example. The base plate 11 is an insulator. As shown in FIG. 1, the base plate 11 includes a plurality of the electrical probe structures 10 for performing a multi-point measurement upon an object to be detected. Each of the electrical probe structures 10 can apply a large current (ranging from 10 s to 100 s amperes) to test electric properties of the object to be detected. Here, the electric properties can include resistance values, voltage values and the like. In the following description, a single electrical probe structure 10 is raised particularly for elucidating the present invention.

Figure 2:
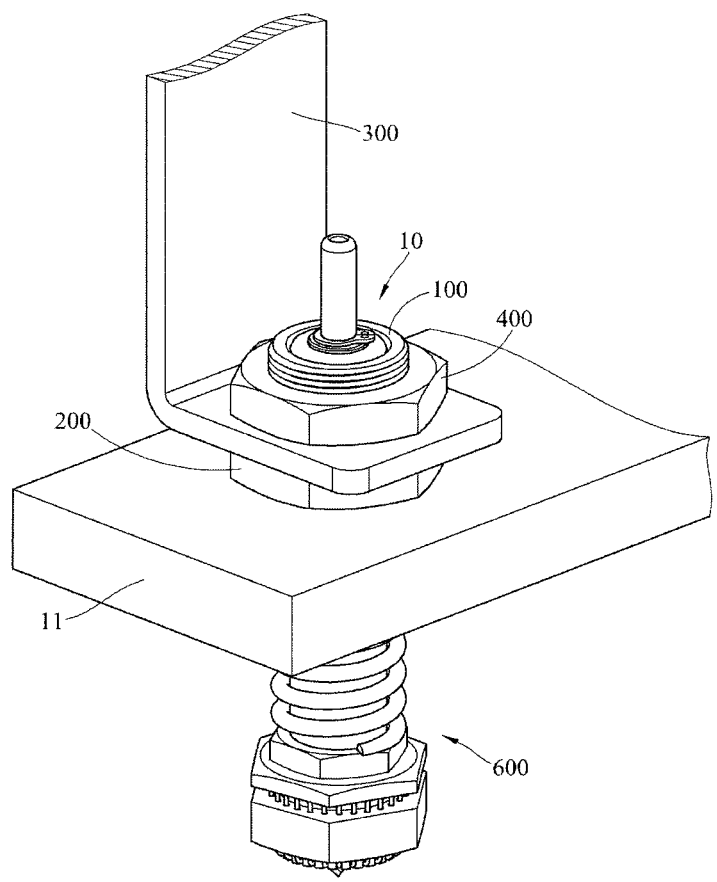
FIG. 2 demonstrates schematically and perspectively one electrical probe structure of FIG. 1.
Figure 3:
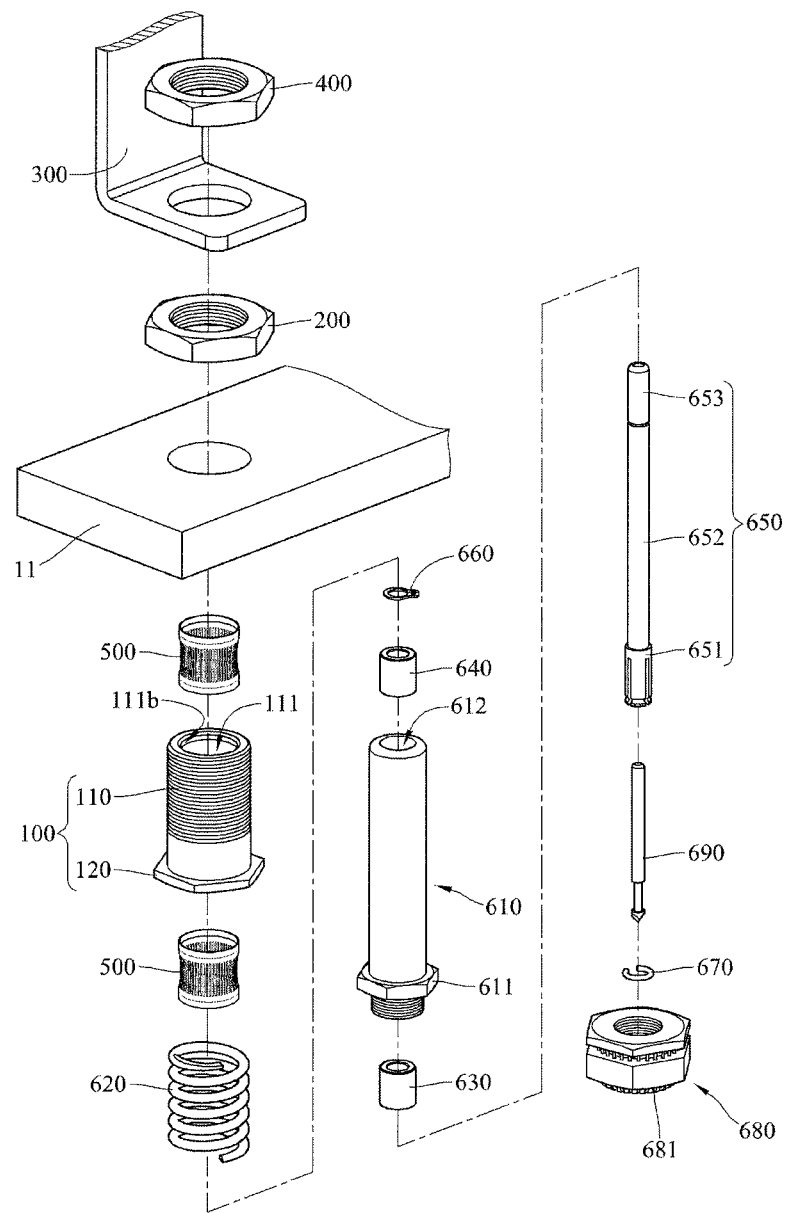
FIG. 3 is a schematic exploded view of FIG. 2.
Figure 4:
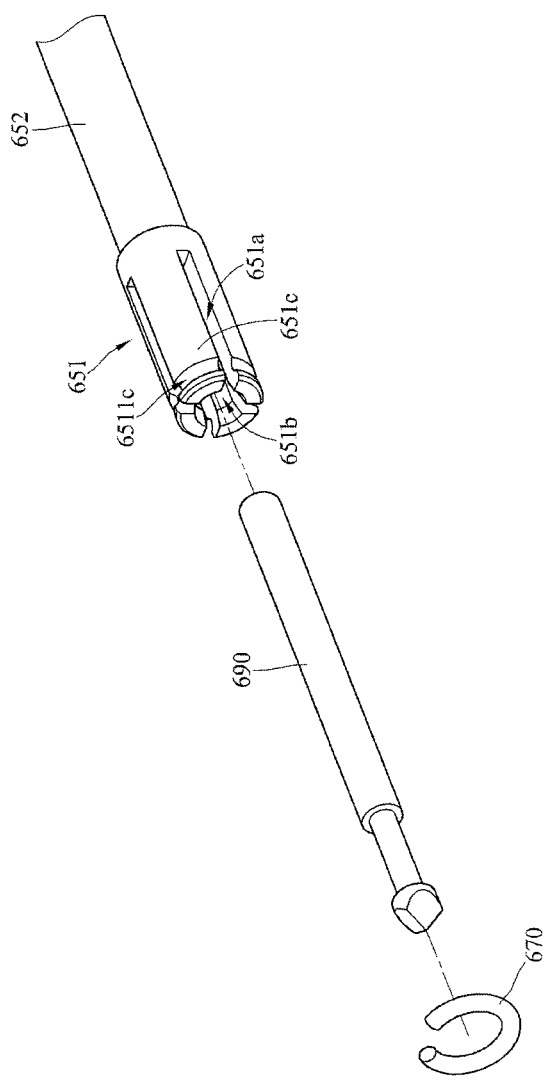
FIG. 4 is an enlarged view of a portion of FIG. 3.
Figure 5:
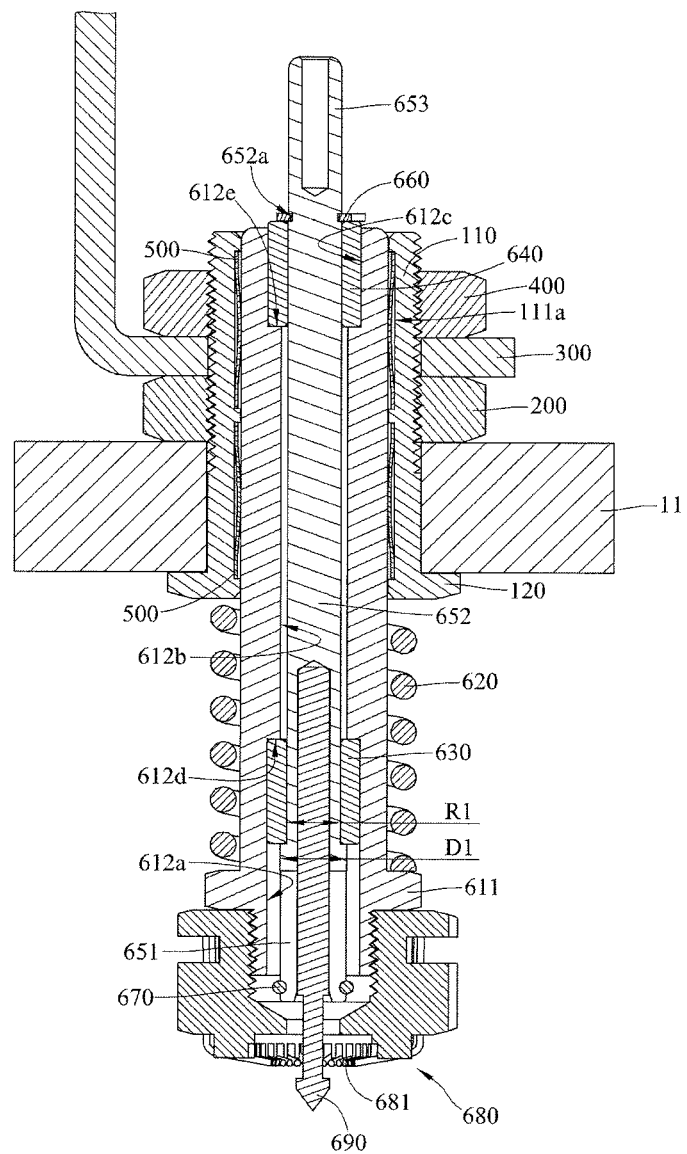
FIG. 5 is a schematic cross-sectional view of FIG. 2.

Refer now to FIG. 2 through FIG. 5; where FIG. 2 demonstrates schematically and perspectively one electrical probe structure of FIG. 1, FIG. 3 is a schematic exploded view of FIG. 2, FIG. 4 is an enlarged view of a portion of FIG. 3, and FIG. 5 is a schematic cross-sectional view of FIG. 2.

The electrical probe structure 10 includes a conductive cylinder 100, a first fastener member 200, a first electrical connecting port 300, a second fastener member 400, two flexible conductive tubes 500 and a probe assembly 600.

The conductive cylinder 100 includes a cylindrical body 110 and an end flange 120. The end flange 120 located at a lower end of the cylindrical body 110 protrudes outward radially with respect to the cylindrical body 110. The cylindrical body 110 is extended upward to penetrate through the base plate 11, with the end flange 120 to act as a stop to contact at the base plate 11. The first fastener member 200 sleeves the cylindrical body 110 and contacts a side of the base plate 11 away from the end flange 120. By providing the first fastener member 200 and the end flange 120, the conductive cylinder 100 can be then fixed to the base plate 11. The first electrical connecting port 300 sleeves the cylindrical body 110 further and contacts the first fastener member 200, so as to establish an electric connection between the first electrical connecting port 300 and the conductive cylinder 100. The second fastener member 400 sleeves the cylindrical body 110 further so as to clamp firmly the first electrical connecting port 300 between the first fastener member 200 and the second fastener member 400.

The cylindrical body 110 of the conductive cylinder 100 has a sliding tunnel 111 extending axially inside along the conductive cylinder 100. The sliding tunnel 111 has two assembling grooves 111a formed as cut-in annular grooves on an inner wall 111b of the sliding tunnel 111. The two flexible conductive tubes 500 are to hold and thus position the two assembling grooves 111a, respectively, inside the cylindrical body 110. Preferably, each of the two flexible conductive tubes 500 can be an elastic metallic sleeve structure with two wider ends and a middle grating structure including a plurality of parallel strings extending in the axial direction.

As shown in FIG. 2 to FIG. 5, the probe assembly 600 includes a first needle cylinder 610, an elastic member 620, a first insulation member 630, a second insulation member 640, a second needle cylinder 650, a fastener ring 660, an annular clip 670, a first probe 680 and a second probe 690.

The first needle cylinder 610 has a middle flange 611 protruding radially, with respect to the cylindrical body 110. The first needle cylinder 610 penetrates the elastic member 620 (formed as a coil spring) and then enters to be disposed in the sliding tunnel 111 of the cylindrical body 110 in a slidable manner. Two opposite ends of the elastic member 620 are constrained by the middle flange 611 and the end flange 120 of the conductive cylinder 100. Inside the sliding tunnel 111, the first needle cylinder 610 is elastically grabbed by the two flexible conductive tubes 500, and thereby establishes an electric connection with the two flexible conductive tubes 500, such that the first needle cylinder 610 can further be electrically connected to the conductive cylinder 100.

The first needle cylinder 610 further has a through tunnel 612 extending along the cylindrical body 110. The through tunnel 612 includes a first tunnel portion 612a, a second tunnel portion 612b, a third tunnel portion 612c, a first stop portion 612d and a second stop portion 612e. The first tunnel portion 612a and the third tunnel portion 612c are connected spatially to two opposing ends of the second tunnel portion 612b, respectively. The first stop portion 612d is located between the first tunnel portion 612a and the second tunnel portion 612b, and the second stop portion 612e is located between the second tunnel portion 612b and the third tunnel portion 612c. The first insulation member 630 and the second insulation member 640 are disposed at the first tunnel portion 612a and the third tunnel portion 612c, respectively.

The second needle cylinder 650 includes a plug-mounting head 651, a cylindrical extending body 652 and a second electrical connecting port 653. The plug-mounting head 651 and the second electrical connecting port 653 are connected with two opposing ends of the cylindrical extending body 652, respectively. A width D1 of the plug-mounting head 651 is larger than an inner diameter R1 of the first insulation member 630. The cylindrical extending body 652 is to penetrate the first insulation member 630, so that the plug-mounting head 651 and the first stop portion 612d can contact two opposing ends of the first insulation member 630, with the first insulation member 630 to space the cylindrical extending body 652 and the first needle cylinder 610. The cylindrical extending body 652 has an annular middle groove 652a, and the cylindrical extending body 652 penetrates through the second insulation member 640. The fastener ring 660 buckles the annular middle groove 652a, such that the fastener ring 660 and the second stop portion 612e can contact two opposing ends of the second insulation member 640 respectively, and the second insulation member 640 can space the cylindrical extending body 652 and the first needle cylinder 610.

In this embodiment, the second needle cylinder 650 is electrically insulated from the first needle cylinder 610 via the first insulation member 630 and the second insulation member 640, so that, when a current passes through the second needle cylinder 650, the current won't be bifurcated to the first needle cylinder 610, by which possible error measurement can be avoided. In particular, if the second electrical connecting port 653 has an annular end groove structure with an outer diameter of 4 mm and an inner diameter of 2 mm, then a binding post can be used to plug the 2 mm annular end groove, or to sleeve the 4 mm rim. Thereupon, areas for connecting the second needle cylinder 650 and the wire can be enlarged, so that the wire can be further fixed to the second electrical connecting port 653 firmly.

The plug-mounting head 651 of the second needle cylinder 650 has a plurality of longitudinal apertures 651a (four in this embodiment) and a probe entrance 651b. These four longitudinal apertures 651a surround the probe entrance 651b, and form four claw plates 651c to the plug-mounting head 651. Each of the claw plates 651c has a section of an annular end groove 6511c to be buckled by the annular clip 670. The first probe 680 is furnished to one end of the first needle cylinder 610 close to the middle flange 611, and electrically connected to the first needle cylinder 610. In this embodiment, the second probe 690 can be a No. 7 probe to plug into the probe entrance 651b, so that the second probe 690 located inside the probe entrance 651b can be electrically connected to the second electrical connecting port 653. The first probe 680 can have a plurality of conductive terminals 681 to surround the second probe 690.

In this embodiment, the plug-mounting head 651 of the second needle cylinder 650 can include, but not limited to, four claw plates 651c separated by the four longitudinal apertures 651a. In some other embodiments, the number of the longitudinal apertures can be arbitrarily determined so as to vary the number of the claw plates. For example, if two longitudinal apertures are embodied, then the plug-mounting head would be furnished with two claw plates.

In addition, in this embodiment, the annular clip 670 is selected to buckle the annular end groove 6511c of each the claw plate 651c. However, in some other embodiments, the four claw plates may waive the inclusion of the annular end groove, and can be directly held tightly by an annular clip.

Further, the second probe 690 is, but not limited to be, positioned by having the annular clip 670 to fasten the four claw plates 651c. In some other embodiments, the annular clip can be replaced by simply using clamping forcing of the four claw plates to hold the second probe.

In the electrical probe structure 10 of this embodiment, the large current (120 amperes for example) can pass to the conductive cylinder 100 via the first electrical connecting port 300, and then to the first probe 680 mounted at the first needle cylinder 610 via the electric connections established by the two flexible conductive tubes 500 and the first needle cylinder 610. By having the first probe 680 to touch the object to be detected, the large current can be transmitted to the object to be detected, then to the second electrical connecting port 653 through the second probe 690, such that the device having the electrical probe structures 10 can receive the return current to further realize the electric properties of the object to be detected.

In the aforesaid passing of the large current, while the large current passes from the conductive cylinder 100 to the first needle cylinder 610, the two flexible conductive tubes 500 form multiple electric connections with the first needle cylinder 610, such that the voltage crossing the conductive cylinder 100 and the first needle cylinder 610 can be significantly reduced. Thereupon, the large current can pass smoothly from the conductive cylinder 100 to the first needle cylinder 610. In addition, in this embodiment, the number of the flexible conductive tubes 500 is two. However, in some other embodiments, the design of the flexible conductive tube shall depend on the amperes of the large current. Namely, the number of the flexible conductive tubes would be proportional to the applied large current.

In this embodiment, while the electrical probe structure 10 is mounted onto the measurement device, the conductive cylinder 100, the first electrical connecting port 300 and the probe assembly 600 can be assembled separately to the measurement device. In detail, the conductive cylinder 100 and the first electrical connecting port 300 can be assembled to the base plate 11 of the measurement device firstly, and then the complete set of the probe assembly 600 can be directly installed into the conductive cylinder 100. Namely, while in mounting the electrical probe structure 10 to the measurement device, the electrical probe structure 10 can be provided in several major parts to be assembled separately onto the measurement device, and thus assembling convenience of the electrical probe structure 10 can be significantly enhanced.

In addition, while in replacing the probe assembly 600, since the second electrical connecting port 653 is the only part of the electrical probe structure 10 to connect the wire via the binding post, so the probe assembly 600 can be easily removed by unplugging the binding post. In comparison with the conventional technique that the wire is soldered onto the probe, the replacement convenience of the probe assembly provided by the present invention is obvious. Further, if only the second probe 690 is to be replaced, then the old second probe 690 can be directly retrieved from the probe entrance 651b for the next replacement.

Figure 6:
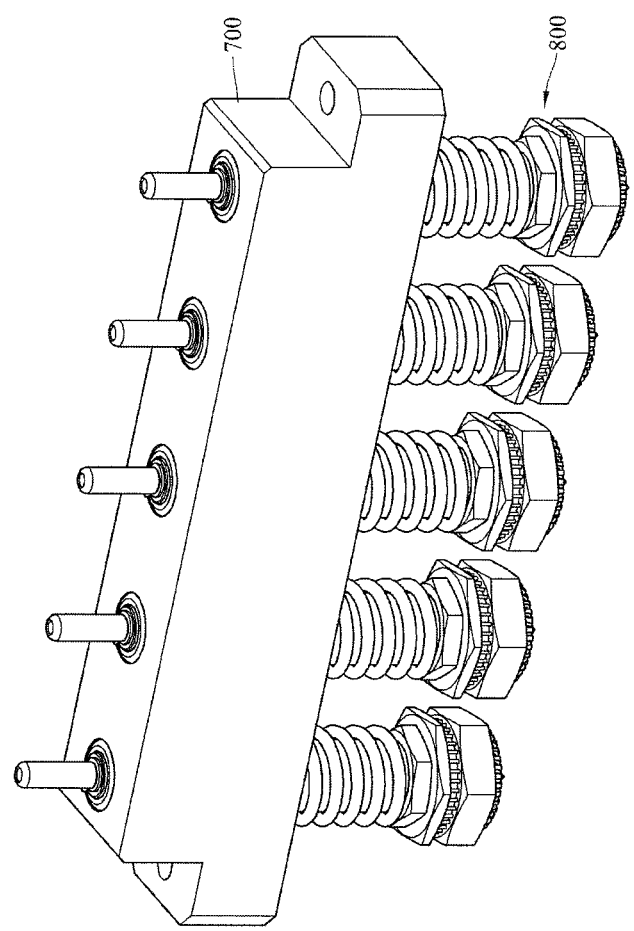
FIG. 6 is a schematic perspective view of a second embodiment of the present invention that includes a plurality of electrical probe structures with the individual probe assemblies to penetrate a common conductive head structure.
Figure 7:
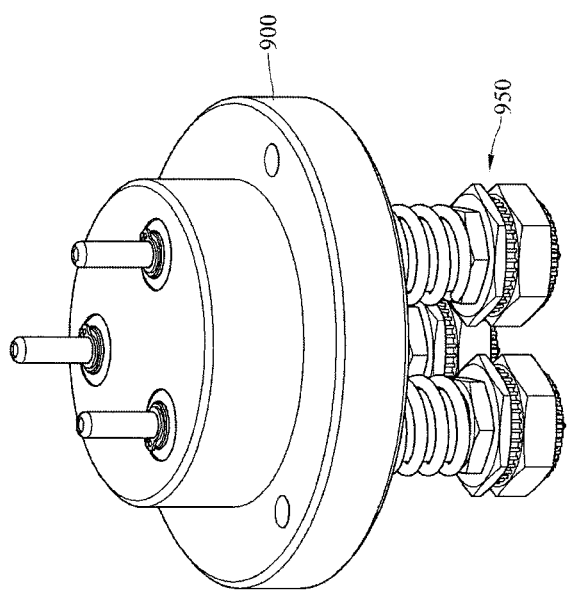
FIG. 7 is a schematic perspective view of a third embodiment of the present invention that includes a plurality of electrical probe structures with the individual probe assemblies to penetrate a common conductive dome structure.

In the electrical probe structure 10 of the aforesaid embodiment, the conductive cylinder 100 can accept only one said probe assembly 600. Refer now to FIG. 6 and FIG. 7; where FIG. 6 is a schematic perspective view of a second embodiment of the present invention that includes a plurality of electrical probe structures with the individual probe assemblies 800 to penetrate a common conductive head structure 700, and FIG. 7 is a schematic perspective view of a third embodiment of the present invention that includes a plurality of electrical probe structures with the individual probe assemblies 950 to penetrate a common conductive dome structure 900. In particular, the probe assemblies 800 of FIG. 6 are in an inline arrangement, while the probe assemblies 950 of FIG. 7 are in an annular arrangement.

In summary, by providing the electrical probe structure of the present invention, the pair of the conductive dome structure fixed on the base plate and the first electrical connecting port fixed on the conductive dome structure is used to replace the conventional probe set that moves with the wire for passing the large current, such that any movement of the electrical probe structure won't shift the conductive cylinder and the first electrical connecting port. Thus, the abrasive wears upon the internal wires of the measurement device having the electrical probe structure can be successfully avoided.

In addition, since the conventional wires originally for passing the large current have been removed, the internal space of the measurement device having the electrical probe structure can be wider, and thus capability in heat dissipation of the measurement device having the electrical probe structure can be substantially enhanced.

In addition, by providing the two flexible conductive tubes to form multiple contacts with the first needle cylinder, the voltage across the conductive cylinder and the first needle cylinder can be significantly reduced, such that the large current can pass smoothly from the conductive cylinder to the first needle cylinder.

Furthermore, while in mounting the electrical probe structure to the measurement device, each of the conductive cylinder, the second electrical connecting port and the probe assembly can be assembled separately, and then assembled to the measurement device one by one. Thereupon, the assembling convenience of the electrical probe structure onto the measurement device can be greatly improved.

Since the second connection port can be provided for connecting the binding post so as to make larger the areas available for connections between the second needle cylinder and the wire, thus the wire can be easily fixed to the second electrical connecting port. In addition, while in replacing the probe assembly, it can be done simply by separating the wire from the second probe. Thereupon, the replacement convenience of the probe assembly can be increased. Further, if the second probe is to be replaced only, it can be done simply by retrieving the second probe directly from the probe entrance.

While the present invention has been particularly shown and described with reference to a preferred embodiment, it will be understood by those skilled in the art that various changes in form and detail may be without departing from the spirit and scope of the present invention.

What is claimed is:

1. An electrical probe structure, to be fixed on a base plate, comprising:
a conductive cylinder, being to be fixed to the base plate, having thereinside a sliding tunnel;
a first electrical connecting port, electrically connected to the conductive cylinder;
at least one flexible conductive tube, furnished inside the sliding tunnel; and at least one probe assembly, including:
: a first needle cylinder, slidably penetrating the conductive cylinder, electrically contacting the at least one flexible conductive tube so as to have the first needle cylinder to electrically connect the first electrical connecting port via the at least one flexible conductive tube and the conductive cylinder; and
: a first probe, mounted and electrically connected to the first needle cylinder.

2. The electrical probe structure of claim 1, wherein the number of the at least one flexible conductive tube is two, the sliding tunnel further having two assembling grooves formed on an inner wall of the sliding tunnel to position the two flexible conductive tubes, respectively.

3. The electrical probe structure of claim 1, further including a first fastener member, wherein the conductive cylinder includes a cylindrical body and an end flange, the end flange extends outward radially with respect to the cylindrical body, the cylindrical body penetrates through the base plate and the first fastener member, the end flange and the first fastener member contact respectively two opposing sides of the base plate, and the sliding tunnel extends axially inside the cylindrical body.

4. The electrical probe structure of claim 3, further including a second fastener member, the first electrical connecting port sleeving the cylindrical body and contacting the first fastener member, the second fastener member sleeving the cylindrical body so as to clamp the first electrical connecting port between the first fastener member and the second fastener member.

5. The electrical probe structure of claim 3, wherein the at least one probe assembly further includes an elastic member, the first needle cylinder has a middle flange extending outward with respect to the cylindrical body, and the first needle cylinder penetrates through the elastic member, so that two opposing ends of the elastic member contact respectively the middle flange and the conductive cylinder.

6. The electrical probe structure of claim 1, wherein the at least one probe assembly further includes a second needle cylinder and a second probe, the second needle cylinder penetrating through the first needle cylinder but electrically insulated from the first needle cylinder, the second needle cylinder including a plug-mounting head, a cylindrical extending body and a second electrical connecting port, the plug-mounting head and the second electrical connecting port being connected respectively to two opposing ends of the cylindrical extending body, the second probe plugging and thus electrically connecting the plug-mounting head, such that the second probe is electrically connected to the second electrical connecting port via the cylindrical extending body.

7. The electrical probe structure of claim 6, wherein the at least one probe assembly further includes a first insulation member, and the first needle cylinder further has a through tunnel extending along the conductive cylinder, the through tunnel including a first tunnel portion, a second tunnel portion and a first stop portion, the first tunnel portion connecting spatially the second tunnel portion, the first stop portion being located between the first tunnel portion and the second tunnel portion, the first insulation member being mounted inside the first tunnel portion, a width of the plug-mounting head being larger than an inner diameter of the first insulation member, the cylindrical extending body penetrating through the first insulation member, so that the plug-mounting head and the first stop portion contact respectively two opposing ends of the first insulation member, and the first insulation member is clamped between the cylindrical extending body and the first needle cylinder.

8. The electrical probe structure of claim 7, wherein the at least one probe assembly further includes a second insulation member and a fastener ring, and the through tunnel further includes a third tunnel portion and a second stop portion, the third tunnel portion connecting spatially a side of the second tunnel portion by being distant to the first tunnel portion, the second stop portion being located between the second tunnel portion and the third tunnel portion, the second insulation member being mounted at the third tunnel portion, the cylindrical extending body having an annular middle groove, the cylindrical extending body penetrating through the second insulation member, the fastener ring buckling the annular middle groove, so that the fastener ring and the second stop portion contact respectively two opposing ends of the second insulation member, and the second insulation member is clamped between the cylindrical extending body and the first needle cylinder.

9. The electrical probe structure of claim 6, wherein the at least one probe assembly further includes an annular clip, and the plug-mounting head has a plurality of longitudinal apertures and a probe entrance, the plurality of longitudinal apertures surrounding the probe entrance to separate the plug-mounting head into a plurality of claw plates, the annular clip buckling the plurality of claw plates, the second probe plugging the probe entrance.

10. The electrical probe structure of claim 1, wherein the number of the at least one probe assembly is one.

* * * * *